United States Patent [19]

Neville et al.

[11] Patent Number: 5,527,423
[45] Date of Patent: Jun. 18, 1996

[54] CHEMICAL MECHANICAL POLISHING SLURRY FOR METAL LAYERS

[75] Inventors: Matthew Neville, Champaign; David J. Fluck, Pesotum; Cheng-Hung Hung, Champaign; Michael A. Lucarelli, Mattoon, all of Ill.; Debra L. Scherber, Orangevale, Calif.

[73] Assignee: Cabot Corporation, Boston, Mass.

[21] Appl. No.: 319,213

[22] Filed: Oct. 6, 1994

[51] Int. Cl.⁶ .............................. B24B 1/00; H01L 21/00
[52] U.S. Cl. ...................... 156/636.1; 252/79.1; 51/308; 106/3
[58] Field of Search ................ 156/636.1, 645.1, 156/656.1; 252/79.1, 79.5; 51/308; 106/3

[56] References Cited

U.S. PATENT DOCUMENTS

| | | | |
|---|---|---|---|
| 3,615,955 | 10/1971 | Regh et al. | 156/17 |
| 3,869,323 | 3/1975 | Basi | 156/17 |
| 3,869,324 | 3/1975 | Basi et al. | 156/17 |
| 3,911,562 | 10/1975 | Youmans | 29/590 |
| 3,922,393 | 11/1975 | Scars, Jr. | 427/215 |
| 3,930,870 | 1/1976 | Basi | 106/3 |
| 3,951,710 | 4/1976 | Basi | 156/17 |
| 3,979,239 | 4/1976 | Walsh | 156/4 |
| 4,057,939 | 11/1977 | Basi | 51/281 |
| 4,108,716 | 8/1978 | Pritchard et al. | 156/636 |
| 4,169,337 | 10/1979 | Payne | 51/283 R |
| 4,184,908 | 1/1980 | Lackner et al. | 156/636 |
| 4,323,422 | 4/1982 | Calawa et al. | 156/636 |
| 4,549,374 | 10/1985 | Basi et al. | 51/283 |
| 4,600,469 | 7/1986 | Fusco et al. | 156/636 |
| 4,671,851 | 6/1987 | Beyer et al. | 156/645 |
| 4,671,852 | 6/1987 | Pyke | 156/652 |
| 4,793,895 | 12/1988 | Kaanta et al. | 156/627 |
| 4,910,155 | 3/1990 | Cote et al. | 437/8 |
| 4,944,836 | 7/1990 | Beyer et al. | 156/645 |
| 4,954,142 | 9/1990 | Carr et al. | 51/309 |
| 4,954,459 | 9/1990 | Avanzino et al. | 437/228 |
| 4,956,313 | 9/1990 | Cote et al. | 437/203 |
| 4,962,064 | 10/1990 | Haskell et al. | 437/228 |
| 4,992,135 | 2/1991 | Doan | 156/636 |
| 5,032,203 | 7/1991 | Doy et al. | 156/345 |
| 5,036,015 | 7/1991 | Sandhu et al. | 437/8 |
| 5,064,683 | 11/1991 | Poon et al. | 427/39 |
| 5,069,002 | 12/1991 | Sandhu et al. | 51/165 |
| 5,081,421 | 1/1992 | Miller et al. | 324/671 |
| 5,084,071 | 1/1992 | Nenadic et al. | 51/309 |
| 5,084,419 | 1/1992 | Sakao | 437/228 |
| 5,094,972 | 3/1992 | Pierce et al. | 437/67 |
| 5,124,780 | 6/1992 | Sandhu et al. | 357/67 |
| 5,137,544 | 8/1992 | Medellin | 51/308 |
| 5,137,597 | 8/1992 | Curry, II et al. | 156/636 |
| 5,157,876 | 10/1992 | Medellin | 51/281 |
| 5,162,248 | 11/1992 | Dennison et al. | 437/8 |
| 5,169,491 | 12/1992 | Doan | 156/636 |
| 5,188,987 | 2/1993 | Ogino | 437/228 |
| 5,194,344 | 3/1993 | Cathey, Jr. et al. | 430/5 |
| 5,196,353 | 3/1993 | Sandhu et al. | 437/8 |
| 5,209,816 | 5/1993 | Yu et al. | 156/636 |
| 5,222,329 | 6/1993 | Yu | 51/165 |
| 5,223,734 | 6/1993 | Lowrey et al. | 257/401 |
| 5,225,034 | 7/1993 | Yu et al. | 156/636 |
| 5,225,358 | 7/1993 | Pasch | 437/33 |
| 5,229,331 | 7/1993 | Doan et al. | 437/228 |
| 5,232,875 | 8/1993 | Tuttle et al. | 437/225 |
| 5,234,867 | 8/1993 | Schultz et al. | 437/225 |
| 5,234,868 | 8/1993 | Cote | 437/225 |
| 5,240,552 | 8/1993 | Yu et al. | 156/636 |
| 5,244,534 | 9/1993 | Yu et al. | 156/636 |
| 5,245,790 | 9/1993 | Jerbic | 51/121 |
| 5,245,794 | 9/1993 | Salagsugan | 51/165 |
| 5,246,884 | 9/1993 | Jaso et al. | 437/225 |
| 5,264,010 | 11/1993 | Brancaleoni et al. | 51/308 |
| 5,265,370 | 11/1993 | Rostoker | 51/165 |
| 5,267,418 | 12/1993 | Currie et al. | 51/216 |
| 5,270,241 | 12/1993 | Dennison et al. | 437/52 |
| 5,271,798 | 12/1993 | Sandha et al. | 156/638 |
| 5,272,117 | 12/1993 | Roth et al. | 437/228 |
| 5,340,370 | 8/1994 | Cadien et al. | 51/308 |

FOREIGN PATENT DOCUMENTS

| | | |
|---|---|---|
| 0121707 | 9/1988 | European Pat. Off. . |
| 9311183 | 6/1993 | WIPO . |

OTHER PUBLICATIONS

Guthrie et al., "Chemical–Mechanical Polishing to Planarize Blanket and Selective CVD Tungsten," Conference Proceedings ULSI VII, Materials Research Society, pp. 527–533.

Guthrie et al., "A four-level VLSI bipolar metallization design with chemical–mechanical planarization," IBM J. Res. Develop., vol. 36, No. 5, Sep. 1992, pp. 845–857.

Landis et al., "Integration of chemical–mechanical polishing into CMOS integrated circuit manufacturing," Thin solid films, 220 (1992), pp. 1–7.

Yu et al., "Antireflection coatings for advanced semiconductor device metallization using laser reflow and chemical mechanical planarization," Appl. Phys. Lett. 59 (16), Oct. 14, 1991, American Institute of Physics, pp. 1978–1980.

Warnock, "A Two–Dimensional Process Model for Chemimechanical Polish Planarization," J. Electrochem Society, vol. 138, No. 8, Aug. 1991, pp. 2398–2402.

Patrick et al., "Application of Chemical Mechanical Polishing to the Fabrication of VSLI Circuit Interconnections," J. Electrochem Society, vol. 138, No. 6, Jun. 1991, pp. 1778–1784.

Kaufman et al., "Chemical Mechanical Polishing for Fabricating Patterned W Metal Features as Chip Interconnects," J. Electrochem. Society, vol. 138, No. 11, Nov. 1991, pp. 3460–3465.

*Primary Examiner*—Thi Dang

[57] ABSTRACT

A slurry for use in chemical-mechanical polishing of a metal layer comprising high purity fine metal oxide particles uniformly dispersed in a stable aqueous medium.

39 Claims, 8 Drawing Sheets

CHEMICAL MECHANICAL POLISHING SLURRY FOR METAL LAYERS

BACKGROUND OF THE INVENTION

1. Field of the Invention

The present invention relates to a chemical mechanical polishing slurry for semiconductor device planarization and, more particularly, to a chemical mechanical polishing slurry for use on polishing metal layers.

2. Background of the Invention

A semiconductor wafer typically includes a substrate, such as such as a silicon or gallium arsenide wafer, on which a plurality of integrated circuits have been formed. Integrated circuits are chemically and physically integrated into a substrate by patterning regions in the substrate and layers on the substrate. The layers are generally formed of various materials having either a conductive, insulating or semiconducting nature. In order for a device to have high yields, it is crucial to start with a flat semiconductor wafer and, as a result, it is often necessary to polish a side or part of a semiconductor wafer. If the process steps of device fabrication are performed on a wafer surface that is not uniform, various problems can occur which may results in a large number of inoperable devices. For example, in fabricating modern semiconductor integrated circuits, it is necessary to form conductive lines or similar structures above a previously formed structure. However, prior surface formation often leaves the top surface topography of a wafer highly irregular, with bumps, areas of unequal elevation, troughs, trenches and other similar types of surface irregularities. As a result, global planarization of such surfaces is necessary to ensure adequate focus depth during photolithography, as well as removing any irregularities and surface imperfections during the various stages of the fabrication process. Although several polishing techniques exist to ensure wafer surface planarity, processes employing chemical mechanical planarization or polishing techniques have achieved widespread usage to planarize the surface of wafers during the various stages of device fabrication in order to improve yield, performance and reliability. In general, chemical mechanical polishing ("CMP") involves the circular motion of a wafer under a controlled downward pressure with a polishing pad saturated with a conventional polishing slurry. For a more detailed explanation of chemical mechanical polishing, please see U.S. Pat. Nos. 4,671,851, 4,910,155 and 4,944,836, the specifications of which are incorporated herein by reference.

Typical polishing slurries available for CMP oxide processes contain an abrasive material such as silica or alumina in an acidic or basic solution. For example, U.S. Pat. No. 5,245,790 to Jerbic describes a technique for chemical mechanical polishing of semiconductor wafers using ultrasonic energy and a silica based slurry in a KOH solution. U.S. Pat. No. 5,244,534 to Yu et al. discloses a method of forming conductive plugs within an insulation layer. The process results in a plug of material, such as tungsten, which is more even with the insulation layer surface than that achieved using conventional plug formation techniques. Slurries of abrasive particles such as $Al_2O_3$ and etchants such as $H_2O_2$ and either KOH or $NH_4OH$ are used in the first CMP step to remove the tungsten at a predictable rate while removing very little of the insulation. The second CMP step utilizes a slurry consisting of an abrasive material, such as aluminum oxide, and an oxidizing component of hydrogen peroxide and water. Similarly, U.S. Pat. No. 5,209,816 to Yu et al. teaches a CMP slurry comprising $H_3PO_4$, $H_2O_2$, $H_2O$ and a solid abrasive material while U.S. Pat. Nos. 5,157,876 and 5,137,544 to Medellin teach stress free CMP agents for polishing semiconductor wafers which include a mixture of water, colloidal silica and bleach containing sodium hypochlorite. U.S. Pat. No. 4,956,313 to Cote et al. discloses a slurry consisting of $Al_2O_3$ particulates, deionized water, a base and an oxidizing agent.

Since CMP has been successfully used to polish oxide surfaces for a number of years, a recent trend in the semiconductor industry is to utilize CMP techniques and slurries for polishing metal layers. However, even though some slurries and polishing techniques have been directed to metal layers, films and plugs, such as tungsten, aluminum and copper, chemical mechanical polishing of these metals for device fabrication has not been well understood or developed. As a result, the use of conventional silica or alumina slurries on metal layers has resulted in unacceptable polishing performance and yielded devices of poor quality. Accordingly, a need remains for improved chemical mechanical polishing techniques and slurries for the same which provide uniform metal layers, free from undesirable contaminants and surface imperfections.

SUMMARY OF THE INVENTION

The present invention is directed to a chemical mechanical polishing slurry for polishing metal layers of semiconductor devices comprising high purity, fine metal oxide particles uniformly dispersed in a stable aqueous medium. The particles have a surface area ranging from about 40 m²/g to about 430 m²/g, an aggregate size distribution less than about 1.0 micron, a mean aggregate diameter less than about 0.4 micron and a force sufficient to repel and overcome the van der Waals forces between the particles. In a preferred embodiment, the metal oxide particles also have a maximum zeta potential greater than about ±10 millivolts. Also disclosed is a method of polishing tungsten layers with the polishing slurry of the present invention.

DETAILED DESCRIPTION OF THE INVENTION

Figure 1:
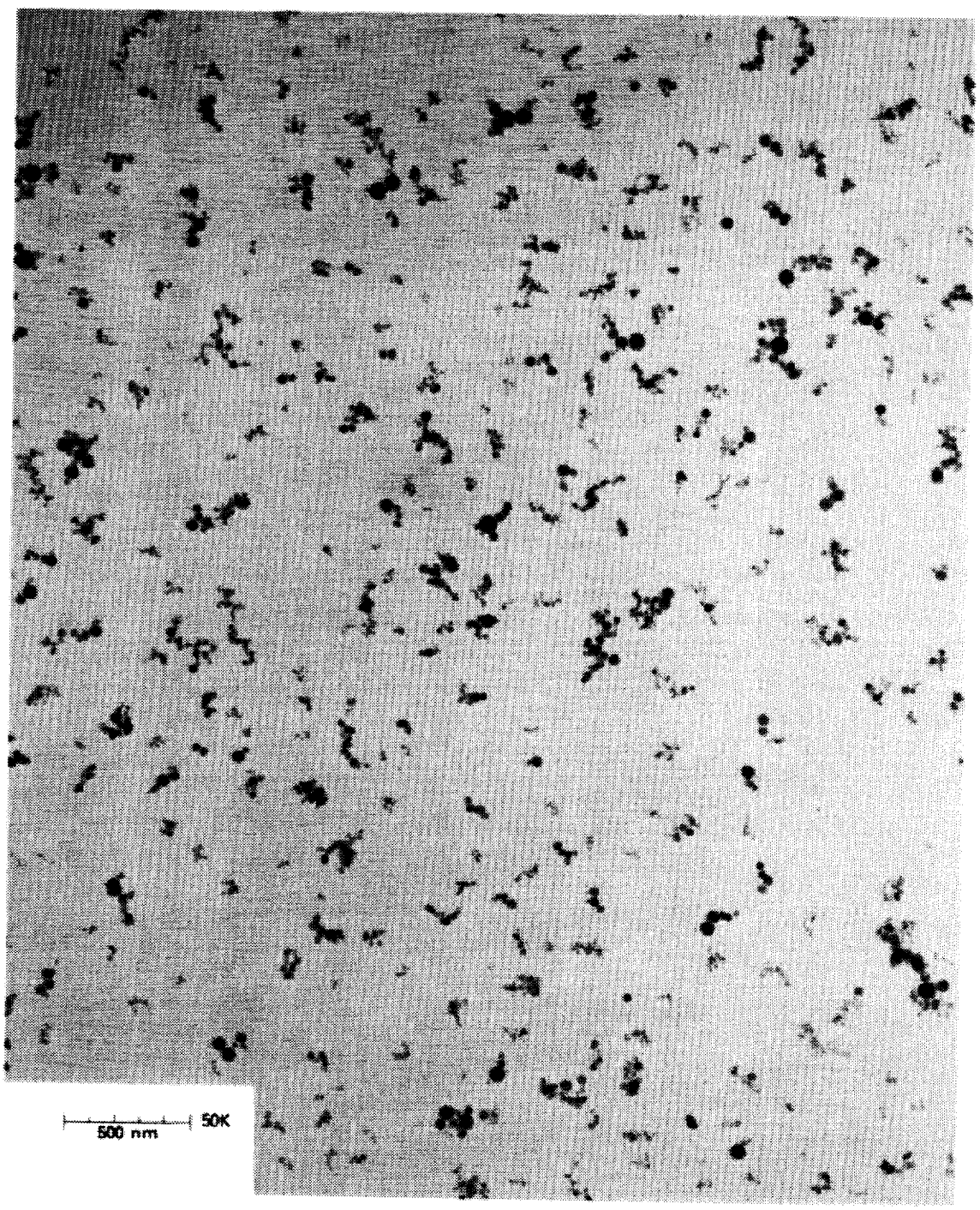
FIG. 1 is a transmission electron micrograph (TEM) showing metal oxide particles of fumed alumina of the present invention at 50,000× magnification.

The present invention is directed to a chemical mechanical polishing slurry comprising high purity, fine metal oxide particles uniformly dispersed in an aqueous medium. The particles of the present invention differ from the "abrasive particles" of the prior art by having a surface area ranging from about 40 $m^2/g$ to about 430 $m^2/g$, an aggregate size distribution less than about 1.0 micron, a mean aggregate diameter less than about 0.4 micron and a force sufficient to repel and overcome the van der Waals forces between the particles. By way of illustration, FIG. 1 is a TEM (transmission electron micrograph) for metal oxide particles of fumed alumina in the slurry of the present invention.

The surface area of the particles, as measured by the nitrogen adsorption method of S. Brunauer, P. H. Emmet, and I. Teller, J. Am. Chemical Society, Volume 60, Page 309 (1938) and commonly referred to as BET, typically ranges from about 40 $m^2/g$ to about 430 $m^2/g$. The particles may comprise between 0.5% and 55% of the slurry depending on the degree of abrasion required. The abrasion of the metal oxide particles, in turn, is a function of the particle composition, the degree of crystallinity and the crystalline phase, e.g. gamma or alpha for alumina. In order to achieve the desired selectivity and polishing rate, it has been found that the optimum surface area and loading level will vary depending upon which fine metal oxide particles are chosen for a particular polishing slurry, as well as the degree of crystallinity and phase of the particles. In one embodiment when a high degree of selectivity is desired, solid loadings of less than 12% by weight for alumina particles having surface areas ranging from about 70 $m^2/g$ to about 170 $m^2/g$ is preferred. At lower surface areas, i.e. less than 70 $m^2/g$, solid loadings of less than 7% is preferred for alumina particles. Similarly when a low selectivity is desired, it has been discovered that when the fine metal oxide particle is fumed silica, surface areas ranging between 40 $m^2/g$ and 250 $m^2/g$ should be present in a range from about 0.5% to about 20% by weight.

Figure 2:
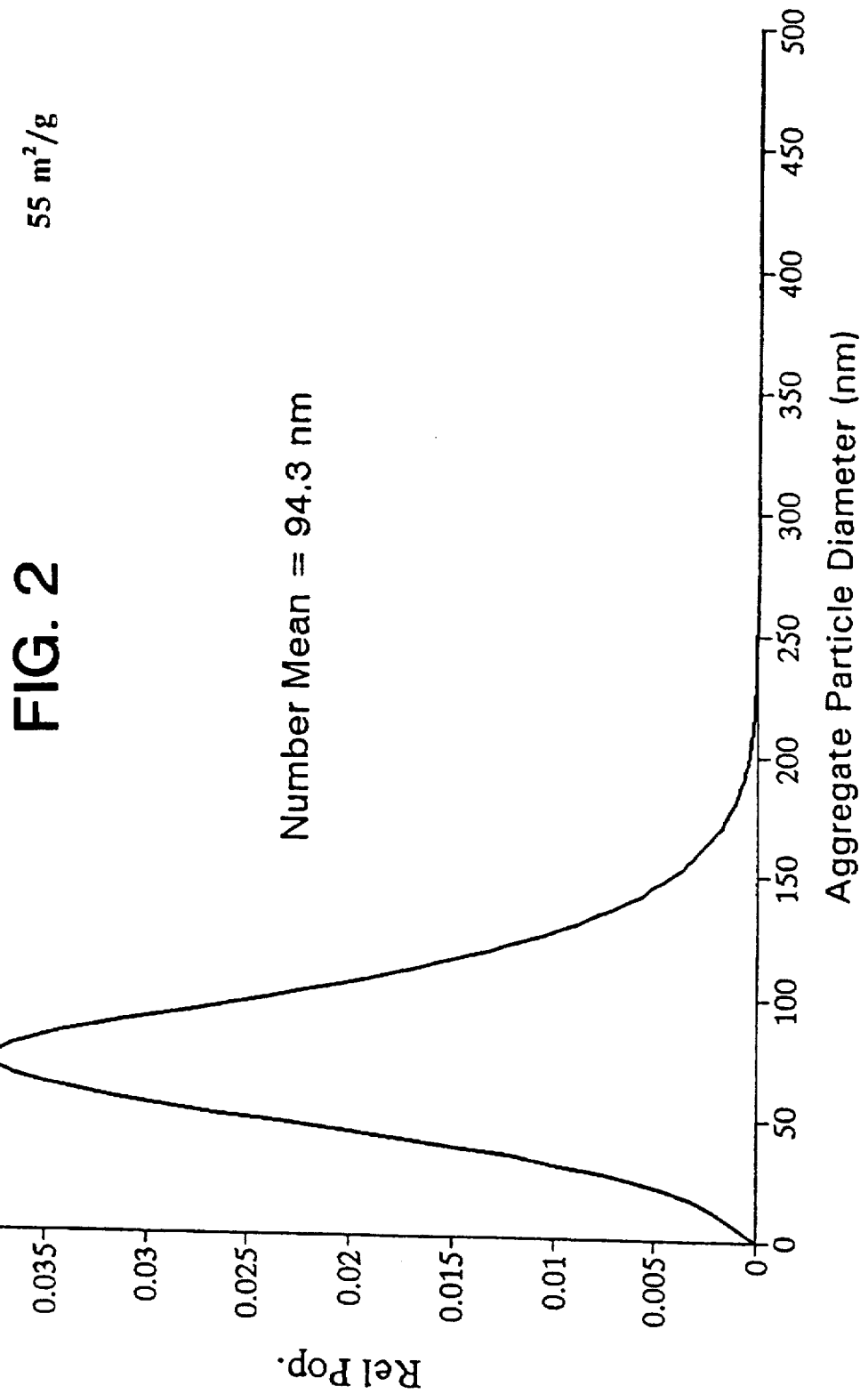
FIG. 2 is an aggregate size distribution for metal oxide particles of fumed alumina for use in the polishing slurry of the present invention.
Figure 3:
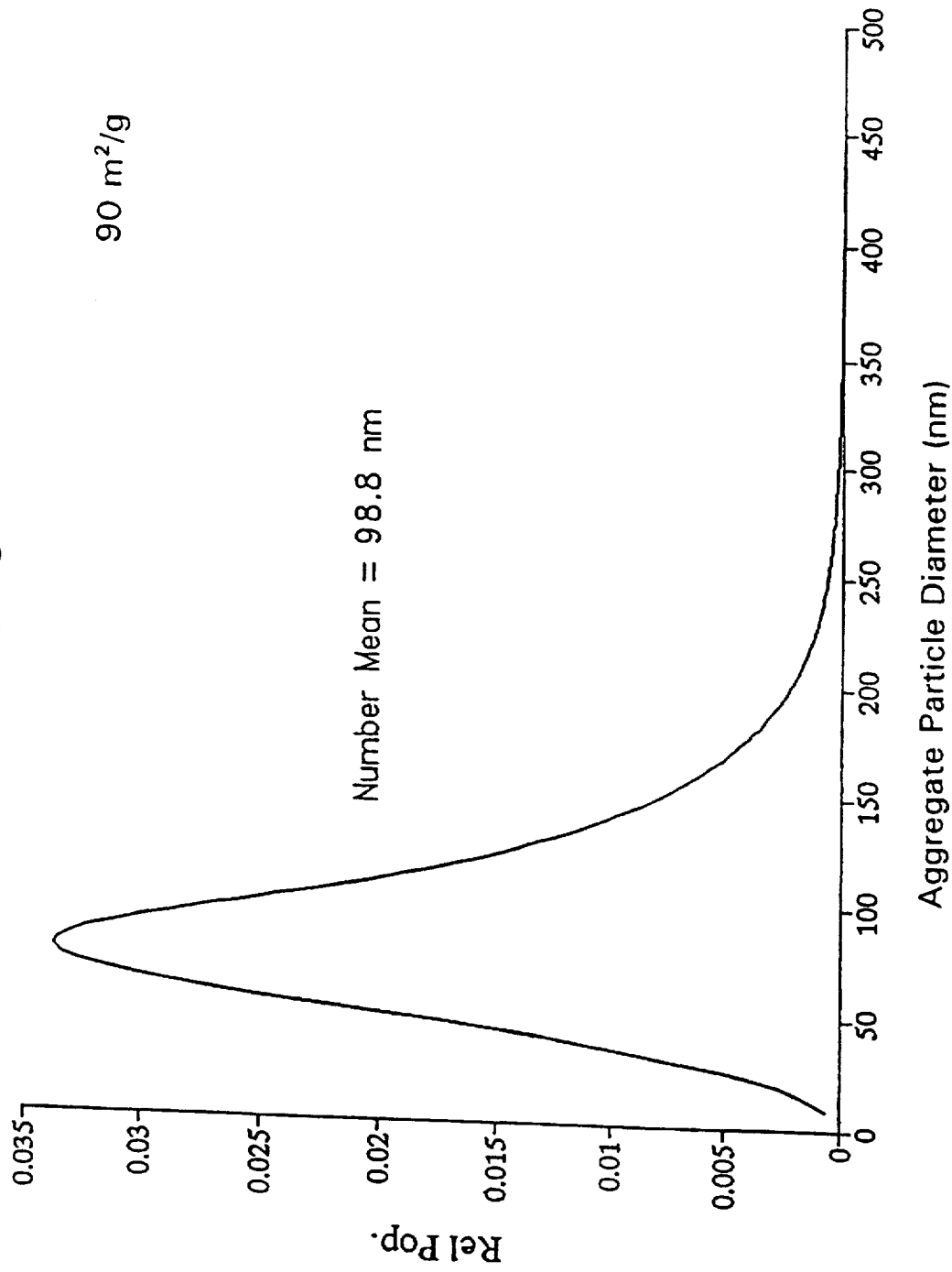
FIG. 3 is an aggregate size distribution for metal oxide particles of fumed silica for use in the polishing slurry of the present invention.

The metal oxide particles of the present invention are of a high purity and have an aggregate size distribution of less than about 1.0 micron in order to avoid scratching, pit marks, divots and other surface imperfections during the polishing. By way of example, FIGS. 2 and 3 illustrate aggregate size distributions for metal oxide particles of the present invention for fumed alumina and silica, respectively. High purity means that the total impurity content is typically less than 1% and preferably less than 0.01% (i.e. 100 ppm). Sources of impurities typically include raw material impurities and trace processing contaminants. The aggregate size of the particles refers to the measurement of the branched, three dimensional chains of fused primary particles (individual molten spheres). It should be noted that although it is common to refer to the terms "particle," "primary particle" and "aggregate particle" interchangeably, such reference is inaccurate and misleading. For example, what is typically meant by the term "particle size" is in fact the average maximum dimension of the "aggregate particle or aggregates" and not the "primary particles." Therefore, careful appreciation and differentiation of aggregates and primary particles is essential to those skilled in the art.

One method of determining the aggregate size distribution in the present invention was by transmission electron microscopy (TEM). In this method, the metal oxide particle sample is dispersed in a liquid medium until the agglomerates have been reversed to aggregates. Its concentration is then adjusted until discrete aggregates are shown on the TEM grid. Multiple fields on the grid are then imaged using an image analysis system manufactured by Kontron Instruments (Everett, Mass.) and stored on a video tape until greater than 1000 aggregates are imaged and stored. The stored images are in turn fed into an image analysis computer with a frame-grabber board for further processing, i.e. cleaning up aberrations, adjusting background and normalizing the image. Individual aggregates in the binary field are measured for a number of particle parameters, i.e. aggregate size, using known techniques such as that described in ASTM D3849-89. Measurements may be recalled individually or in the form of statistical or histogram distributions.

In order for the polishing slurry of the present invention to be an effective alternative to conventional slurries, it is important that the aggregates of the metal oxide particles are uniformly dispersed in a stable aqueous medium. By uniformly dispersed is meant that the aggregates are isolated and well distributed throughout the medium. By stable is typically meant that the aggregates will not re-agglomerate and settle out (e.g. form a hard, dense sediment). In a preferred embodiment, the aggregates will remain stable for at least a three month period of time. Critical to achieving slurry stability, it has been further discovered that the metal oxides particles of the present invention, in addition to having an aggregate size distribution less that 1.0 micron, have an average or mean aggregate diameter of less than about 0.4 micron and that the particles of the present invention have a force sufficient to repel and overcome the van der Waals attractive forces between the particles. The mean aggregate diameter refers to the average equivalent spherical diameter when using TEM image analysis, i.e. based on the cross-sectional area of the aggregate. By force is meant that either the surface potential or the hydration force of the metal oxide particles must be sufficient to repel and overcome the van der Waals attractive forces between the particles.

Figure 4:
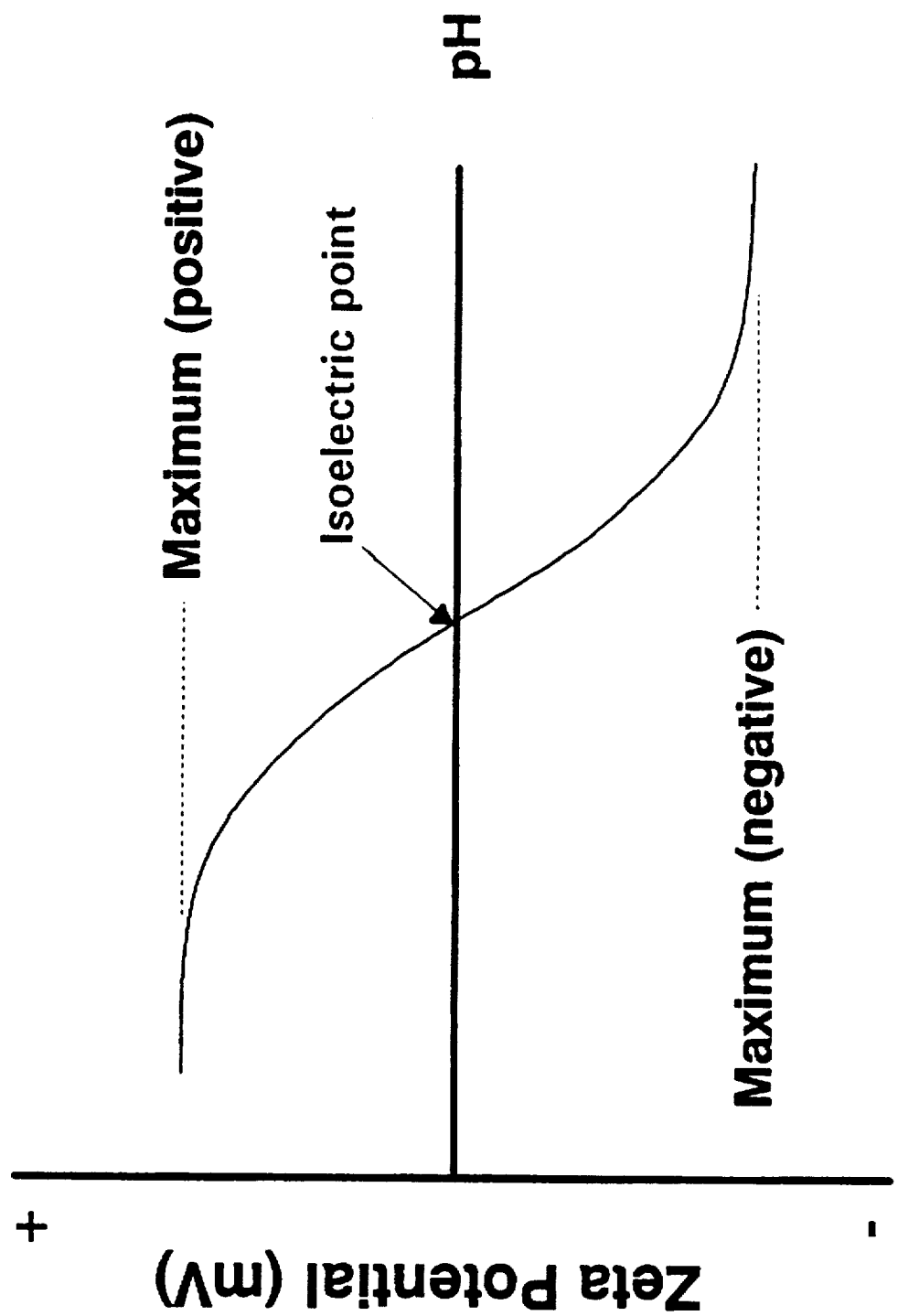
FIG. 4 illustrates a theoretical plot of pH on the x-axis versus zeta potential in millivolts on the y-axis.

In a preferred embodiment, the metal oxide particles will have a mean aggregate size distribution less than 0.3 micron and also have a maximum zeta potential greater than ±10 millivolts. Zeta potential ($\zeta$) is the potential difference, measured in a liquid, between the shear plane and the bulk of the liquid beyond the limits of the electrical double layer. The zeta potential is dependent on the pH of the aqueous medium as illustrated in FIG. 4. For a given metal oxide particle composition, the isoelectric point is defined as the pH at which zeta potential is zero. As the pH is increased or decreased away from the isoelectric point, the surface charge is increased negatively or positively, respectively. As the pH continues to increase or decrease, the surface charge will reach an asymptote, the asymptote being referred to as the maximum zeta potential. It should be noted that the maximum zeta potential and isoelectric point are functions of the metal oxide composition and that the maximum zeta potential can be effected by the addition of salts to the aqueous medium. For a more complete discussion of zeta potentials, please see R. J. Hunter, *Zeta Potential in Colloid Science* (Academic Press 1981).

Although zeta potential cannot be measured directly, the zeta potential can be measured by a variety of known techniques, such as electrophoresis, electrokinetic sonic amplitude, and analytical techniques including ultrasonic vibration potential. In the present invention, the zeta potential referred to was determined by measurement of the electrokinetic sonic amplitude using the Matec MBS-8000 instrument (available from Matec Applied Sciences, Inc., Hopkington, Mass.).

In another embodiment, an oxidizing component may be added to the polishing slurry to oxidize the metal layer to its corresponding oxide. For example, in the present invention, an oxidizing component is used to oxidize a metal layer to its corresponding oxide, such as tungsten to tungsten oxide. The layer is mechanically polished to remove the tungsten oxide from the layer. Although a wide range of oxidizing components may be used, preferred components include oxidizing metal salts, oxidizing metal complexes, iron salts such as nitrates, sulfates, EDTA, citrates, potassium ferricyanide and the like, aluminum salts, sodium salts, potassium salts, ammonium salts, quaternary ammonium salts, phosphonium salts, peroxides, chlorates, perchlorates, permanganates, persulfates and mixtures thereof. Typically, the oxidizing component is present in the slurry in an amount sufficient to ensure rapid oxidation of the metal layer while balancing the mechanical and chemical polishing components of the slurry. In addition, it has further been discovered that a critical relationship exists between the concentration of the oxidizing component and the colloidal stability of the polishing slurry. As such, oxidizing components are typically present in the slurry from about 0.5% to 15% by weight, and preferably in a range between 1% and 7% by weight.

In order to further stabilize a polishing slurry containing an oxidizing component against settling, flocculation and decomposition of the oxidizing component, a variety of additives, such as surfactants, polymeric stabilizers or other surface active dispersing agents, can be used. Many examples of suitable surfactants for use in the present invention are disclosed in, for example, Kirk-Othmer, *Encyclopedia of Chemical Technology*, 3rd Edition, Vol. 22 (John Wiley & Sons, 1983); Sislet & Wood, *Encyclopedia of Surface Active Agents* (Chemical Publishing Co., Inc., 1964) and available manufacturing literature, including for example McCutcheon's *Emulsifiers & Detergents, North American and International Edition* (McCutcheon Division, The MC Publishing Co., 1991); Ash, *The Condensed Encyclopedia of Surfactants* (Chemical Publishing Co., Inc. 1989); Ash, *What Every Chemical Technologist Wants to Know About . . . Emulsifiers and Wetting Agents, Volume I* (Chemical Publishing Co., Inc. 1988); Tadros, *Surfactants* (Academic Press, 1984); Napper, *Polymeric Stabilization of Colloidal Dispersion* (Academic Press, 1983); and Rosen, *Surfactants & Interfacial Phenomena*, 2nd edition (John Wiley & Sons, 1989), all of which are incorporated herein by reference. In one embodiment, a surfactant consisting of a copolymer of polydimethyl siloxane and polyoxyalkylene ether was found to be suitable.

In general, the amount of an additive used, such as a surfactant, in the present invention should be sufficient to achieve effective steric stabilization of the slurry and will typically vary depending on the particular surfactant selected and the nature of the surface of the metal oxide particle. For example, if not enough of a selected surfactant is used, it will have little or no effect on stabilization. On the other hand, too much of the surfactant may result in undesirable foaming and/or flocculation in the slurry. As a result, additives like surfactants should generally be present in a range between about 0.001% and 10% by weight. Furthermore, the additive may be added directly to the slurry or treated onto the surface of the metal oxide particle utilizing known techniques. In either case, the amount of additive is adjusted to achieve the desired concentration in the polishing slurry.

The metal oxide particles of the present invention are typically precipitated aluminas, fumed silicas or fumed aluminas and preferably are fumed silicas or fumed aluminas. The production of fumed silicas and aluminas is a well-documented process which involves the hydrolysis of suitable feedstock vapor, such as silicon tetrachloride or aluminum chloride, in a flame of hydrogen and oxygen. Molten particles of roughly spherical shapes are formed in the combustion process, the diameters of which are varied through process parameters. These molten spheres of fumed silica or alumina, typically referred to as primary particles, fuse with one another by undergoing collisions at their contact points to form branched, three dimensional chain-like aggregates. The force necessary to break aggregates is considerable and often considered irreversible. During cooling and collecting, the aggregates undergo further collision that may result in some mechanical entanglement to form agglomerates. Agglomerates are thought to be loosely held together by van der Waals forces and can be reversed, i.e. de-agglomerated, by proper dispersion in suitable media.

The precipitated metal oxide particles may be manufactured utilizing conventional techniques and are typically formed by the coagulation of the desired particles from an aqueous medium under the influence of high salt concentrations, acids or other coagulants. The particles are filtered, washed, dried and separated from residues of other reaction products by conventional techniques known to those skilled in the art.

Once produced, the metal oxide is slowly added to deionized water to form a colloidal dispersion. The slurry is completed by subjecting the dispersion to high shear mixing using conventional techniques. The pH of the slurry is adjusted away from the isoelectric point to maximize colloidal stability. The polishing slurry of the present invention may be used as a one package system (metal oxide particles and oxidizing component, if desired, in a stable aqueous medium) or two package system (the first package consists of the metal oxide particles in a stable aqueous medium and the second package consists of oxidizing component) with any standard polishing equipment appropriate for use on the desired metal layer of the wafer. The two package system is used when an oxidizing component decomposes or hydrolyses in the presence of certain metal oxide particles over time. In the two package system, the oxidizing component may be added to the slurry just prior to polishing.

The polishing slurry of the present invention has been found useful in providing effective polishing to metal layers at desired polishing rates while minimizing surface imperfections and defects. Non-limiting illustrations of the polishing slurry of the present invention follow.

EXAMPLE 1

Two polishing slurries were prepared. The first slurry consisted of 3 weight percent fumed alumina, 5 weight percent ferric nitrate and the remainder deionized water. The second slurry consisted of 3 weight percent fumed silica, 5 weight percent ferric nitrate and the remainder deionized water. Further properties of both slurries are described in Table I. The two slurries were utilized to chemically-mechanically polish a tungsten layer having a thickness of approximately 7500 Å. The polishing conditions and performance results are illustrated in Table II.

TABLE I

| Slurry Base | Surface Area (m²/g) | Aggregate Diameter (nm) | Max. Zeta Potential (mV) | Phase |
|---|---|---|---|---|
| Fumed Alumina | 55 | 86 | >+30 | 80% gamma |
| Fumed Silica | 90 | 109 | >+12 | Amorphous |

TABLE II

| Slurry Base | Pressure (psi) | Flow Rate (ml/min) | Table Speed (rpm) | Spindle Speed (rpm) | Polishing (Å/min) | Selectivity* | Quality† |
|---|---|---|---|---|---|---|---|
| Fumed Alumina | 5 | 200 | 50 | 50 | 3000 | 110:1 | High |
| Fumed Silica | 5 | 200 | 50 | 50 | 2000 | 10:1 | High |

(*Thermal Oxide; †High = Less than 10 defects/wafer)

Figure 5:
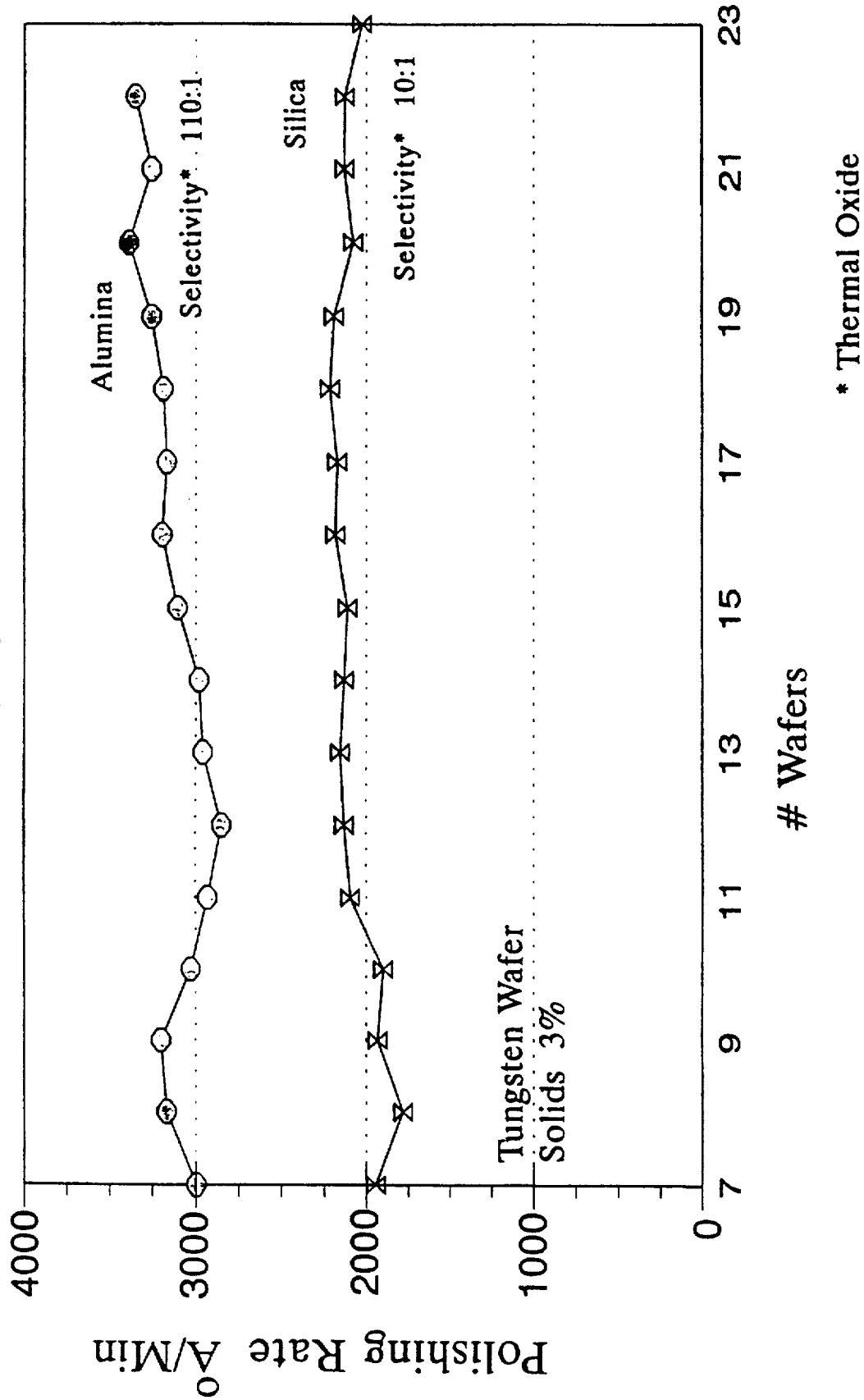
FIG. 5 illustrates the effect of the particle composition on tungsten polishing rate and selectivity to thermal oxide for a series of wafers utilizing the polishing slurry of the present invention. The x-axis indicates the wafer number and the y-axis indicates the polishing rate of tungsten in Å/minute.

As can be seen from Table II, and further illustrated in FIG. 5, both polishing slurries of the present invention were effective in achieving acceptable polishing rates and wafer surfaces of a high quality. Moreover, it can be seen that the composition of the metal oxide particle and its phase have an impact on the polishing rate of the tungsten layer and on selectivity (i.e. the polishing rate ratio between tungsten and thermal oxide). As a result, the particular metal oxide chosen for polishing a layer of tungsten may depend on the desired selectivity and polishing rate.

EXAMPLE 2

For comparative purposes, a conventional slurry was prepared consisting of 8 weight percent of a commercial alumina, 5 weight percent ferric nitrate and the remainder deionized water. The slurry was utilized to chemically mechanically polish a tungsten layer having a thickness of approximately 7500 Å. Under similar polishing conditions to that used in Example 1, the slurry of commercial alumina removed 750 Å/min and produced wafers of a poor quality. The polishing rate obtained by the slurry of commercial alumina was unacceptable for most polishing applications.

EXAMPLE 3

Five polishing slurries were prepared to investigate the effect of particle morphology and solids content on the polishing performance for a fumed alumina slurry. The first, second and third slurries, which consisted of 8 weight percent fumed alumina, 5 weight percent ferric nitrate and the remainder deionized water, were prepared to examine the effect of particle morphology and crystallinity under aggressive polishing conditions, i.e. high pressure, high table speed, high solids loading. The fourth and fifth slurries, which consisted of 3 weight percent fumed alumina, 5 weight percent ferric nitrate and the remainder deionized water, were prepared to examine the effect of particle morphology and crystallinity under less aggressive polishing conditions, i.e. low pressure, low table speed and low solids loading. Further properties of the slurries are described in Table III. The five slurries were utilized to chemically-mechanically polish a tungsten layer having a thickness of approximately 7500 Å. The polishing conditions and performance results are illustrated in Table IV.

TABLE III

| Slurry | Surface Area (m²/g) | Aggregate Diameter (nm) | Max. Zeta Potential (mV) | Phase |
|---|---|---|---|---|
| 1 | 55 | 86 | −+20–35 | 80% gamma |
| 2 | 85 | 88 | >+30 | 40% gamma |
| 3 | 100 | 87 | >+20 | 20% gamma |
| 4 | 55 | 86 | >+30 | 80% gamma |
| 5 | 100 | 87 | >+20 | 20% gamma |

TABLE IV

| Slurry | Pressure (psi) | Flow Rate (ml/min) | Table Speed (rpm) | Spindle Speed (rpm) | Polishing (Å/min) | Selectivity* | Quality† |
|---|---|---|---|---|---|---|---|
| 1 | 9 | 200 | 100 | 25 | 4850 | 50:1 | Low |
| 2 | 9 | 200 | 100 | 25 | 3900 | 110:1 | Low |
| 3 | 9 | 200 | 100 | 25 | 3700 | NA | High |
| 4 | 6 | 200 | 50 | 50 | 3100 | NA | High |
| 5 | 6 | 200 | 50 | 50 | 600 | NA | High |

(*Thermal Oxide; †High = Less than 10 defects/wafer; Low = Greater than 100 defect/wafer.)

Figure 6:
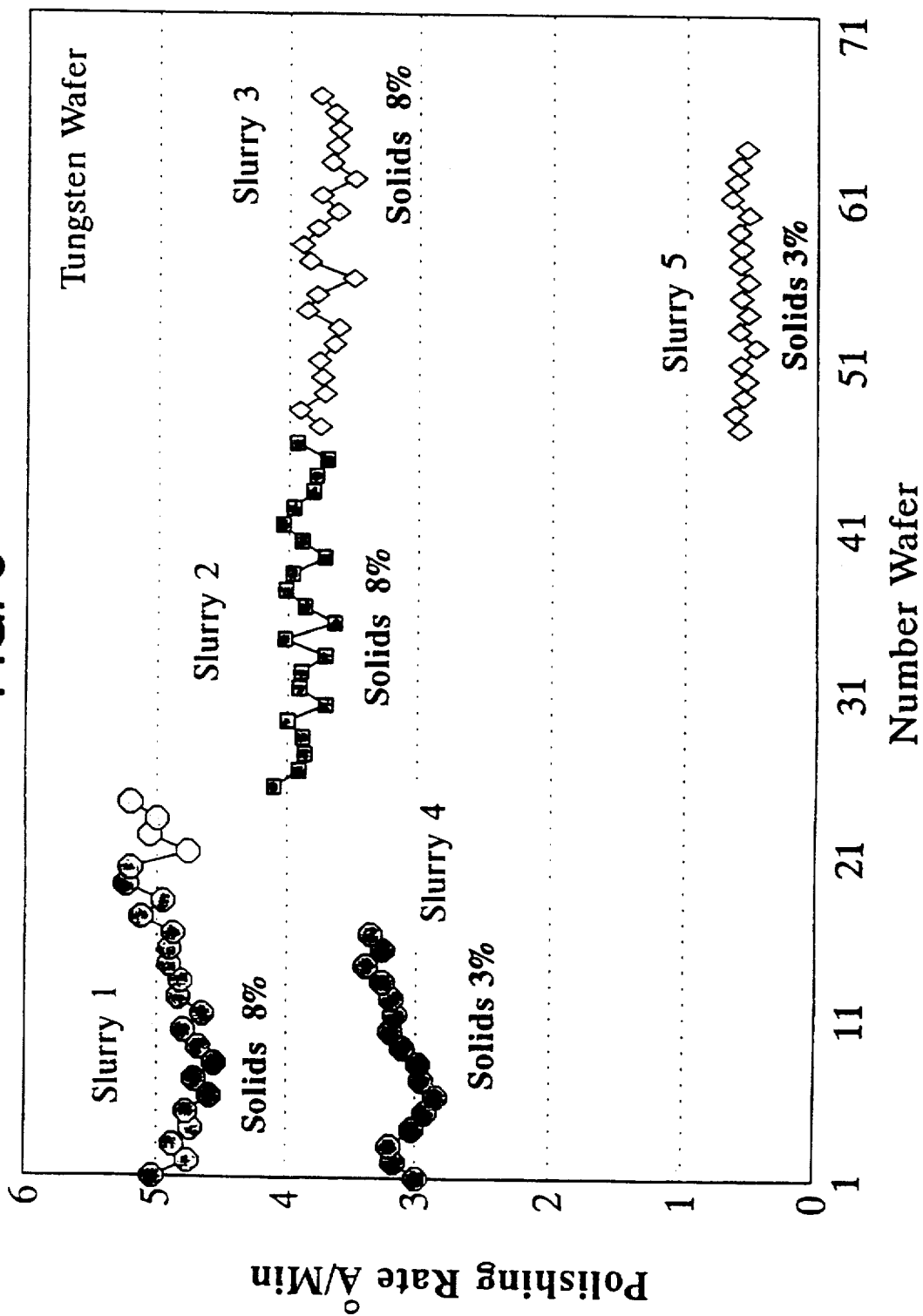
FIG. 6 illustrates the effect on particle morphology, phase and solids content on tungsten polishing rate for a series of wafers utilizing the polishing slurry of the present invention. The x-axis indicates the wafer number and the y-axis indicates the polishing rate of tungsten in Å/minute.

Under the aggressive polishing conditions of slurries 1–3, the phase and morphology, i. e. surface area, of the fumed alumina particles have been found to have a significant effect on selectivity (i.e. the polishing rate ratio between tungsten and thermal oxide) and surface quality and a less dramatic effect on polishing rate, as illustrated in Table IV and further represented in FIG. 6. Under the less aggressive conditions of slurries 4 and 5, the phase and morphology have a significant effect on polishing rate and surface quality. For example, high quality wafers were produced by polishing with slurries 3 (at 8% loading), 4 (at 3% loading) and 5 (at 3% loading). However, a higher solids loading level was needed for the high surface area aluminas in order to also achieve a suitable polishing rate. On the other hand, slurries 1 (at 8% loading) and 2 (at 8% loading), although achieving very high polishing rates, produced wafers with low surface quality. Although not completely understood, it has therefore important to recognize, as demonstrated herein, that the inter-relationship between the composition of the slurry and morphology of the fine metal oxide particles (i.e. surface area, aggregate size and diameter, degree of crystallinity, crystalline phase) is critical to achieving an effective polishing slurry.

EXAMPLE 4

A polishing slurry was prepared consisting of 8 percent fumed silica, 5 weight percent ferric nitrate and the remainder deionized water. Further properties of the slurry are described in Table V. The slurry was utilized to chemically-mechanically polish an aluminum layer having a thickness of approximately 7500 Å. The polishing conditions and performance results are illustrated in Table VI.

TABLE V

| Particle Comp. | Surface Area ($m^2/g$) | Aggregate Diameter (nm) | Max. Zeta Potential (mV) | Phase |
| --- | --- | --- | --- | --- |
| Fumed Silica | 90 | 109 | —+12 | Amorphous |

TABLE VI

| Slurry | Pressure (psi) | Flow Rate (ml/min) | Table Speed (rpm) | Spindle Speed (rpm) | Polishing (Å/min) | Selectivity* | Quality† |
| --- | --- | --- | --- | --- | --- | --- | --- |
| Fumed Silica | 9 | 200 | 50 | 25 | 2932 | 80:1 | High |

(*Thermal Oxide; †High = Less than 10 defects/wafer)

Figure 7:
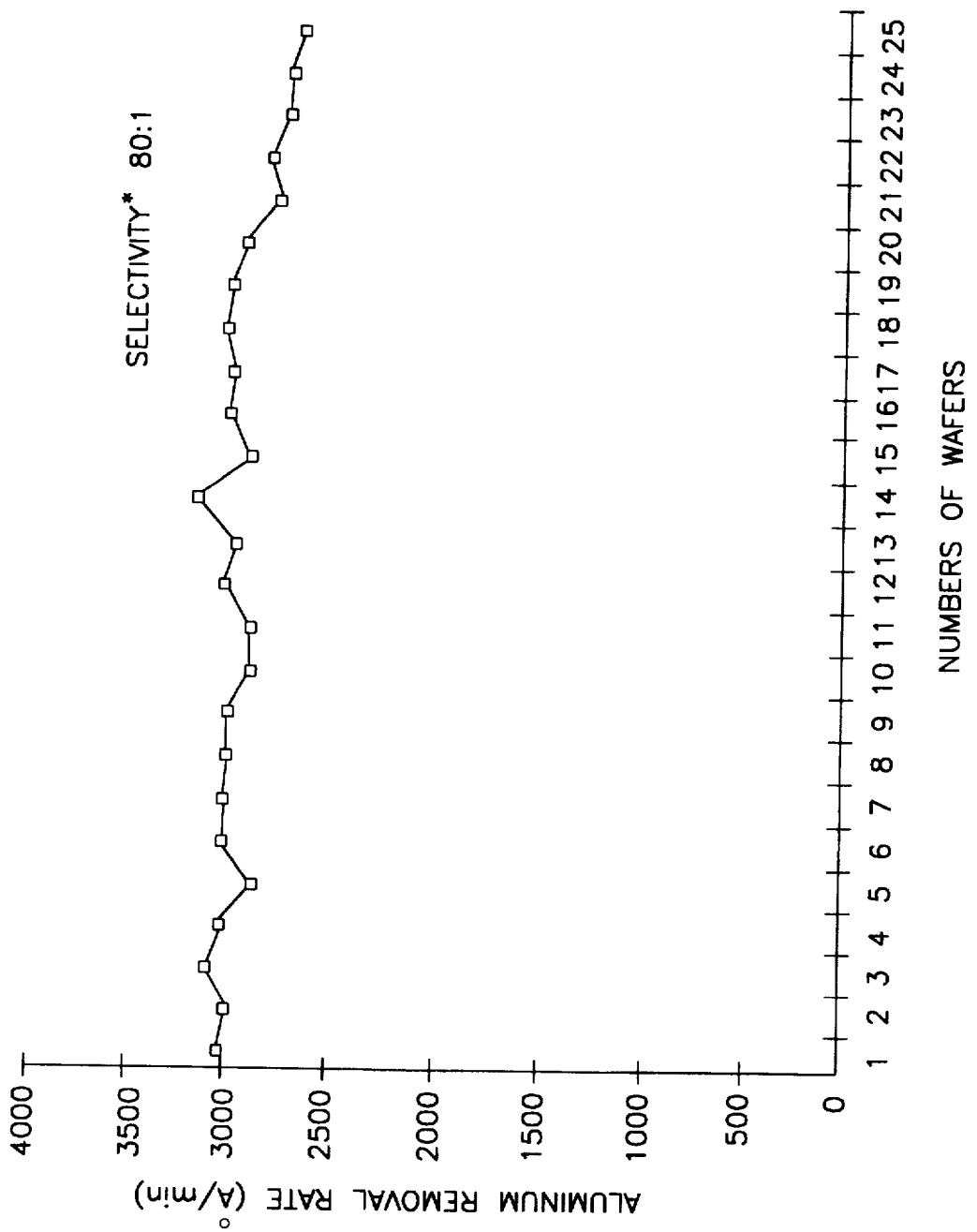
FIG. 7 illustrates the polishing rate of aluminum and selectivity to thermal oxide for a series of wafers utilizing the polishing slurry of the present invention. The x-axis indicates the wafer number and the y-axis indicates the polishing rate of aluminum in Å/minute.

As shown in Table VI and further illustrated in FIG. 7, the polishing slurry of the present invention is effective in achieving an acceptable polishing rate for an aluminum layer and wafers with high surface quality.

EXAMPLE 5

Two slurries were prepared to illustrate the effect of aggregate size distribution and maximum zeta potential on colloidal stability. The first slurry consisted of 8 weight percent fumed alumina as described in the present invention, 5 weight percent ferric nitrate and the remainder deionized water. The second slurry consisted of 8 weight percent of a commercially available precipitated alumina sold under the name Ultralox M100. Further properties of the slurries are listed in Table VII.

TABLE VII

| Slurry | Surface Area ($m^2/g$) | Mean Aggregate Diameter (nm) | Max. Zeta Potential (mV) |
| --- | --- | --- | --- |
| 1 | 55 | 94.3 | +32 |
| 2 | NA | 450 | +10 |

Figure 8:
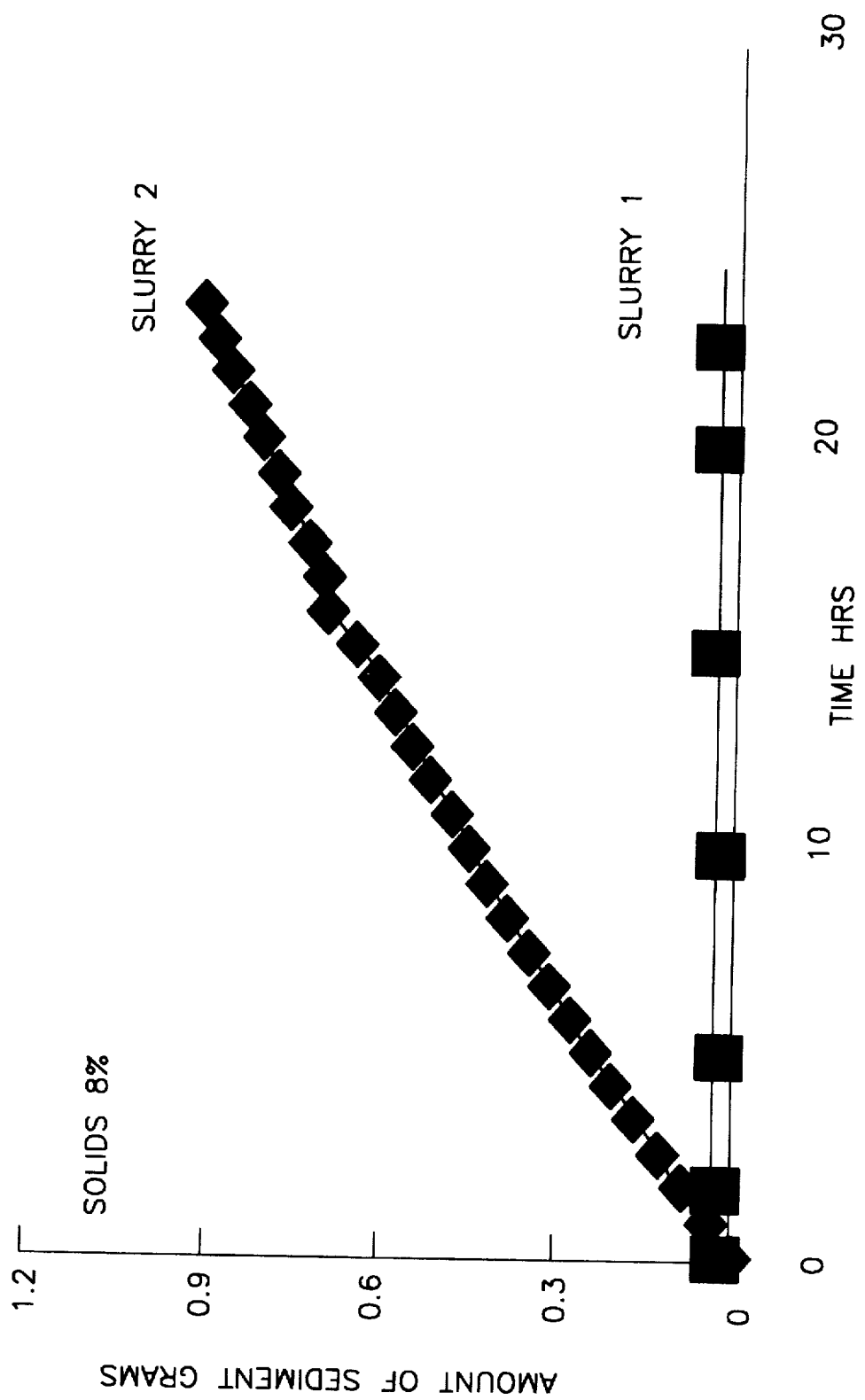
FIG. 8 illustrates the influence that aggregate size distribution and zeta potential has on colloidal stability by plotting the amount of sediment as a function of time.

FIG. 8 illustrates the amount of metal oxide particles in the respective slurries which settled over a twenty-four hour period. The particles were measured using a Dynometer instrument manufactured by Byk Gardner, Inc. As noted, no settling was detected in slurry 1 of the present invention. On the other hand, slurry 2 of commercially available alumina showed a continuous build-up in sediment over the twenty-four hour period. At the end of the period, the bulk of the alumina had settled out to form a dense hard cake. When used at this time without additional steps to redisperse the cake and stabilize the slurry, slurry 2 achieved low polishing rates and produced significant scratching on the wafer, thus yielding a wafer of poor quality.

As described herein, the polishing slurry of the present invention has been found particularly useful in chemical mechanical planarization to remove uneven topography, layers of material, surface defects including scratches, roughness, or contaminant particles such as dirt or dust. As a result, semiconductor processes utilizing this slurry experience an improvement in surface quality, device reliability and yield as compared to conventional etch back techniques. Although the fine metal oxide particles have been directed to aluminas and silicas, it is understood that the teachings herein have applicability to other fine metal oxide particles such as germania, ceria, titania and the like. Furthermore, the metal oxide particles may be utilized to polish other metal surfaces such as copper and titanium, as well as underlayers such as titanium, titanium nitride and titanium tungsten.

It is further understood that the present invention is not limited to the particular embodiments shown and described herein, but that various changes and modifications may be made without departing from the scope and spirit of the invention.

What is claimed is:

1. A method for chemical-mechanical polishing a metal layer of a substrate, the method which comprises the steps of:
   a) providing a chemical mechanical polishing slurry comprising high purity, alumina particles uniformly dispersed in an aqueous medium having a surface area ranging from about 40 $m^2/g$ to about 430 $m^2/g$, an aggregate size distribution less than about 1.0 micron, a mean aggregate diameter less than about 0.4 micron and a force sufficient to repel and overcome the van der Waals forces between the particles, wherein said slurry is stable; and
   b) chemical mechanical polishing a metal layer on a semiconductor substrate with said slurry.

2. The method of claim 1 wherein said metal layer is selected from the group consisting of: tungsten, aluminum, copper, titanium, and alloys thereof.

3. The method of claim 2 wherein said metal layer is tungsten.

4. The method of claim 3 wherein said tungsten layer further comprising at least one underlayer selected from the group consisting of: titanium, titanium nitride and titanium tungsten and mixtures thereof.

5. The method of claim 1 wherein said particles are present in a range between about 0.5% and 55% by weight.

6. The method of claim 1 wherein said alumina particles have a surface area less than about 70 m²/g and are present in said slurry in a range less than about 7% by weight.

7. The method of claim 1 wherein said alumina particles have a surface area ranging between about 70 m²/g to about 170 m²/g and are present within said slurry in a range less than about 12% by weight.

8. The method of claims 6 or 7 wherein said alumina is a precipitated alumina or a fumed alumina.

9. The method of claim 1 wherein said particles have a maximum zeta potential greater than about ±10 millivolts.

10. The method of claim 1 wherein said slurry further comprises an oxidizing component.

11. The method of claim 10 wherein said oxidizing component is an oxidizing metal salt.

12. The method of claim 10 wherein said oxidizing component is an oxidizing metal complex.

13. The method of claim 10 wherein said oxidizing component is selected from the group consisting of: iron salts, aluminum salts, sodium salts, potassium salts, ammonium salts, quaternary ammonium salts, phosphonium salts, peroxides, chlorates, perchlorates, permanganates, persulfates and mixtures thereof.

14. The method of claim 1 wherein said slurry further comprises a surfactant.

15. The method of claim 14 wherein the surfactant is selected from the group consisting of nonionic surfactants, anionic surfactants, cationic surfactants, amphoteric surfactants and mixtures thereof.

16. The method of claim 14 wherein said surfactant is selected from the group consisting of: polyalkyl siloxanes, polyaryl siloxanes, polyoxyalkylene ethers, and mixtures and copolymers thereof.

17. A chemical-mechanical polishing slurry for polishing a metal layer comprising:

high purity, alumina particles uniformly dispersed in an aqueous medium having a surface area ranging from about 40 m²/g to about 430 m²/g, an aggregate size distribution less than about 1.0 micron, a mean aggregate diameter less than about 0.4 micron and a force sufficient to repel and overcome the van der Waals forces between the particles, wherein said slurry is colloidally stable.

18. The slurry of claim 1 wherein said particles are present in a range between about 0.5% and 55% by weight.

19. The slurry of claim 1 wherein said alumina particles have a surface area less than about 70 m²/g and are present in said slurry in a range less than about 7% by weight.

20. The slurry of claim 1 wherein said alumina particles have a surface area ranging between about 70 m²/g to about 170 m²/g and are present within said slurry in a range less than about 12% by weight.

21. The slurry of claims 19 or 20 wherein said alumina is a precipitated alumina or a fumed alumina.

22. The slurry of claim 1 wherein said particles have a maximum zeta potential greater than about ±10 millivolts.

23. The slurry of claim 1 wherein said slurry further comprises a surfactant.

24. The slurry of claim 23 wherein the surfactant is selected from the group consisting of: nonionic surfactants, anionic surfactants, cationic surfactants, amphoteric surfactants and mixtures thereof.

25. The slurry of claim 23 wherein said surfactant is selected from the group consisting of: polyalkyl siloxanes, polyaryl siloxanes, polyoxyalkylene ethers, and mixtures and copolymers thereof.

26. A chemical-mechanical polishing slurry for polishing a metal layer comprising high purity, alumina particles uniformly dispersed in an aqueous medium having a surface area ranging from about 40 m²/g to about 430 m²/g, an aggregate size distribution less than about 1.0 micron, a mean aggregate diameter less than about 0.4 micron and a force sufficient to repel and overcome the van der Waals forces between the particles and an oxidizing component, wherein said slurry is colloidally stable.

27. The slurry of claim 26 wherein said particles are present in a range between about 0.5% and 55% by weight.

28. The slurry of claim 26 wherein said alumina particles have a surface area less than about 70 m²/g and are present in said slurry in a range less than about 7% by weight.

29. The slurry of claim 26 wherein said alumina particles have a surface area ranging between about 70 m²/g to about 170 m²/g and are present within said slurry in a range less than about 12% by weight.

30. The slurry of claims 28 or 29 wherein said alumina is a precipitated alumina or a fumed alumina.

31. The slurry of claim 26 wherein said particles have a maximum zeta potential greater than about ±10 millivolts.

32. The slurry of claim 26 wherein said oxidizing component is an oxidizing metal salt.

33. The slurry of claim 26 wherein said oxidizing component is an oxidizing metal complex.

34. The slurry of claim 26 wherein said oxidizing component is selected from the group consisting of: iron salts, aluminum salts, sodium salts, potassium salts, ammonium salts, quaternary ammonium salts, phosphonium salts, peroxides, chlorates, perchlorates, permanganates, persulfates and mixture thereof.

35. The slurry of claim 26 wherein said slurry further comprises an additive in an amount sufficient to prevent decomposition of the oxidizing component and maintain the colloidal stability of the slurry.

36. The slurry of claim 35 wherein said additive is a surfactant.

37. The slurry of claim 35 wherein the surfactant is selected from the group consisting of nonionic surfactants, anionic surfactants, cationic surfactants, amphoteric surfactants and mixtures thereof.

38. The slurry of claim 36 wherein said surfactant is selected from the group consisting of: polyalkyl siloxanes, polyaryl siloxanes, polyoxyalkylene ethers, and mixtures and copolymers thereof.

39. The slurry of claim 26 wherein said alumina particle is fumed alumina comprising at least 50% gamma phase and said oxidizing component is iron nitrate.

* * * * *

UNITED STATES PATENT AND TRADEMARK OFFICE
CERTIFICATE OF CORRECTION

PATENT NO. : 5,527,423
DATED : June 18, 1996
INVENTOR(S) : Neville, et al

It is certified that error appears in the above-indentified patent and that said Letters Patent is hereby corrected as shown below:

Col. 1, line 14, delete second occurrence of words "such as."

Col. 1, line 25, the term "results" should read, --result--.

Col. 9, line 8, the term "has" should read, --is--.

Col. 11, line 48, the terms "claim 1" should read, --claim 17--.

Col. 11, line 50, the terms "claim 1" should read, --claim 17--.

Col. 11, line 53, the terms "claim 1" should read, --claim 17--.

Col. 11, line 59, the terms "claim 1" should read, --claim 17--.

Col. 12, line 1, the terms "claim 1" should read, --claim 17--.

Signed and Sealed this

Twenty-second Day of July, 1997

Attest:

BRUCE LEHMAN

Attesting Officer

Commissioner of Patents and Trademarks